Figure 1:
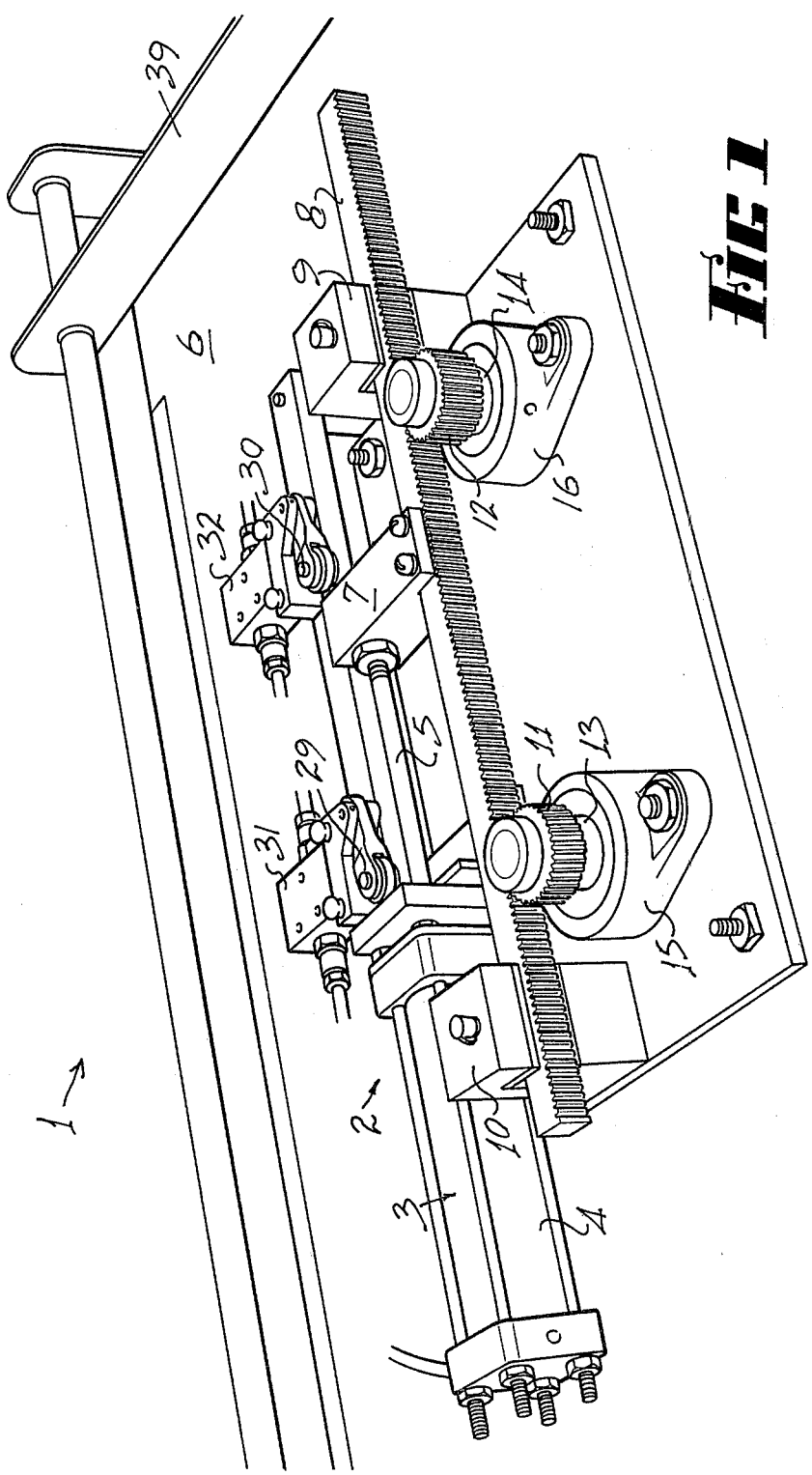

United States Patent [19]
Blight

[11] 4,023,229
[45] May 17, 1977

[54] PRINTING PLATE WASHING APPARATUS

[75] Inventor: Langdon R. Blight, Kent Town, Australia

[73] Assignee: Alison M. Blight, Kent Town, Australia

[22] Filed: Mar. 29, 1976

[21] Appl. No.: 671,160

[30] Foreign Application Priority Data
  Apr. 3, 1975  Australia ............................ 1100/69

[52] U.S. Cl. ...................................... 15/77; 51/151
[51] Int. Cl.² ......................................... A46B 15/00
[58] Field of Search ........... 15/77, 102, 100; 134/6; 354/31, 7; 51/151, 157

[56] References Cited
UNITED STATES PATENTS

| 3,896,470 | 7/1975 | Hovekamp | 354/317 |
| 3,953,225 | 4/1976 | Hovekamp | 15/102 |

Primary Examiner—Edward L. Roberts
Attorney, Agent, or Firm—McNenny, Pearne, Gordon, Gail, Dickinson & Schiller

[57] ABSTRACT

Apparatus for the washing out of an unpolymerized portion of a photo polymer printing plate using a selective solvent and brushes, the drive effecting the scrubbing action being either hydraulic or pneumatic and preferably coupling either the brush means or the photo polymer printing plate holding means by means of synchronously driven cranks.

12 Claims, 8 Drawing Figures

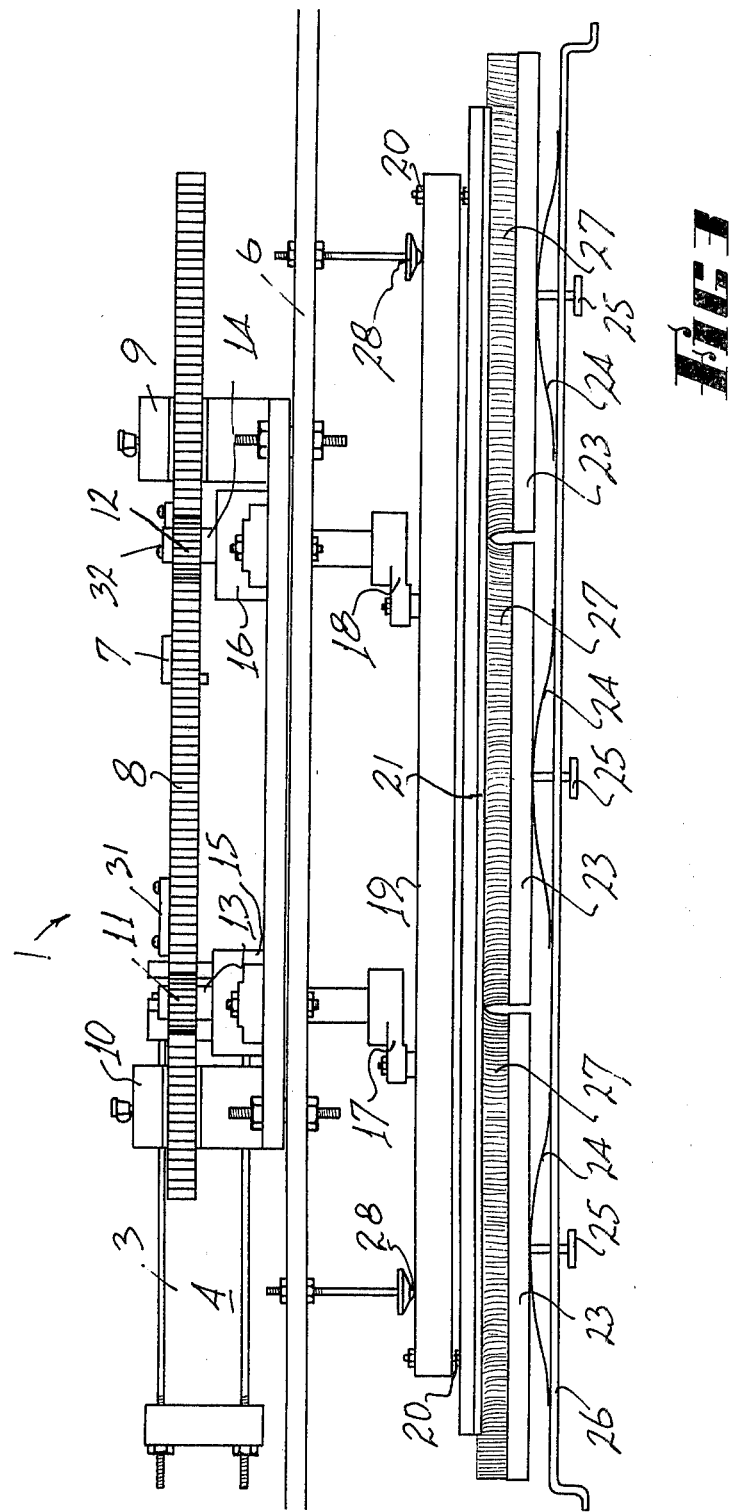

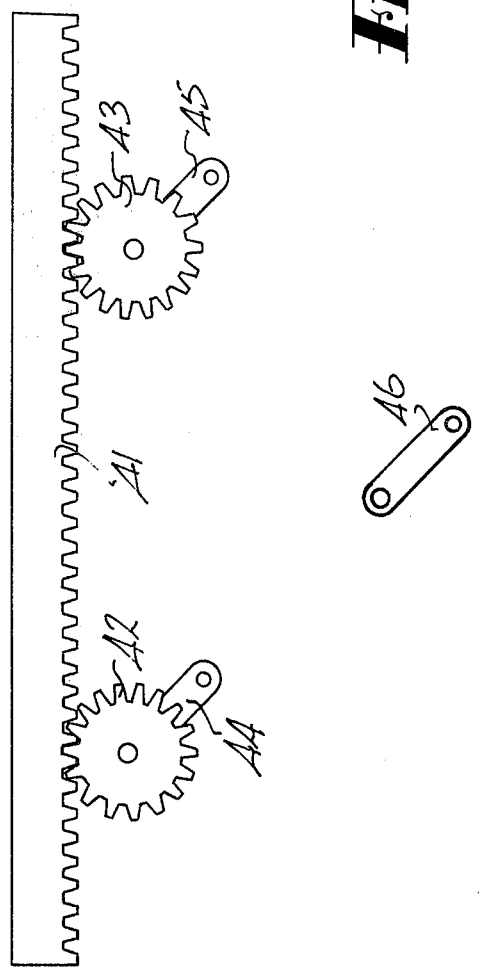

PRINTING PLATE WASHING APPARATUS

This invention relates to apparatus to be used for washing out of an unpolymerised portion of a photo polymer printing plate subsequent to exposure of light to make the plate suitable for printing.

A process now commonly in use and which uses material sold under the registered Trade Mark "NYLOPRINT" involves placing photo polymer printing plate including a film of unpolymerised monomer beneath a light pattern and it is so arranged that such exposure can activate a catalyst so that polymerisation may occur where a film is subjected to such exposure and this material is then stabilized where subjected to this exposure.

The resulting plate however has unpolymerised monomer which must be then removed and whereas several methods of removal are used, a most effective method includes the selective dissolving of the monomer as distinct from the polymer.

It is found necessary that the monomer should be subjected to a physical brushing action at the same time as being within the solvent.

This invention relates to apparatus to be used for this purpose.

Special problems arise with this apparatus in that the solvent that has to be used has been found to have a vapour which is highly flammable and with certain proportions of air, can be explosive.

This has meant that selection of equipment has to be on the basis that there is negligible chance of electric sparks or other sparks causing ignition of the vapours.

One particular type of machine that has been previously used, has included an electrically driven motor the drive to the motor being by way of contactors which thus have to be positioned a substantial distance from the apparatus.

Furthermore, the motor has to be of a particularly high standard and include complete shielding so that there is no possibility of sparks being generated which may ignite the explosive vapours.

There is of course always the danger that wiring feeding the motor can be subjected to high frequency electrical transmitted signals and it is almost impossible to fully guard against such potential induction and this resulting in some insulation breakdown and therefore sparks which could cause ignition of vapours.

Accordingly it must be considered that a vigorous spraying of the solvent might be a more desirable method of achieving removal of the unpolymerized monomer although this method also has substantial disadvantages both from the point of view of creating substantial evaporative problems and also requiring pumps to effect a high pressure of the solvent and also difficulties to ensure a uniform spray distribution to effect uniform removal of the unpolymerised monomer.

Such then is typical of problems that have hitherto been experienced and these set at least the presently known background to the present invention.

The object generally of this invention is to propose an arrangement which can at least go some way to reducing the above problems and in particular provide equipment that can be used with modest safety but which at the same time can be economically manufactured and therefore provide an economic solution to the above problem.

According to one form of this invention this can be said to reside in apparatus for the washing out of an unpolymerised portion of a photo polymer printing plate, such apparatus being of a type including a container for holding of selected washing out solvent, photo polymer printing plate holding means to hold the printing plate with at least the exposed face of the printing plate within solvent within the container, brush means within the container with bristles positioned to engage against the exposed face of any printing plate held by the photo polymer printing plate holding means, and drive means to effect relative movement between the printing plate holding means and the brush means whereby to effect a scrubbing action against the exposed face of any printing plate held by the photo polymer printing plate holding means, the invention being characterized in that the drive means include a fluid operated motor means by which the relative movement between the photo polymer printing plate holding means and the brush means is able to be effected, and mechanically operable change over means arranged to periodically stop the said relative movement proceeding in one direction of a predetermined path and to cause this to recommence in a contra direction and this arranged so as to cause the bristles of the brush means to move at least momentarily against their previous laid over direction.

According to a further characterization of the invention, the drive means include a rotatable crank, the crank portion of which is secured to either the photo polymer printing plate holding means or the brush means.

According to a further characterization of the invention, there are provided at least two cranks spaced apart and pivotally supported, the pivot axis being, in each case, parallel one with respect to the other, and the crank in each case being secured both either to the photo polymer printing plate holding means or the brush means.

In a further characterization of the invention, this includes the further feature that at least the two cranks being each pivotally supported, are coupled to the drive motor means by a common drive coupling so that each crank is drivable synchronously one with respect to the other.

According to a further characterization of the invention, the drive motor means includes a pneumatic ram including a piston within a cylinder.

According to a further preferred feature characterizing the invention, the drive motor means are connectable to a supply of high pressure gaseous fluid and the supply includes means to change the supply so as to have the result that the piston is urged to move with a reciprocating motion upon operation of the change means for the supply.

It will be seen that incorporating a fluid operated motor means firstly has meant that the scrubbing action can be achieved by apparatus and change over mechanism which can all be closely within the vicinity of the apparatus itself without the danger of electrical flash over and ignition of explosive vapours and furthermore it has been found that such features can be achieved at a cost which is substantially below that which has been previously considered necessary.

Indeed, as will be appreciated from the description of the preferred embodiment, all of the essential operating mechanisms can be attached to a lid which can close the container in which the solvent is held and furthermore, such apparatus can be made to last for a substantial period of time operating through the duty cycle and because all the mechanism can be clearly visible to an operator, it can be easily rectified if any part appears to malfunction.

There are other preferred features characterizing the invention but these will best be understood by reference both to preferred embodiments which will now be described and to claims accompanying the specification.

Figure 6:
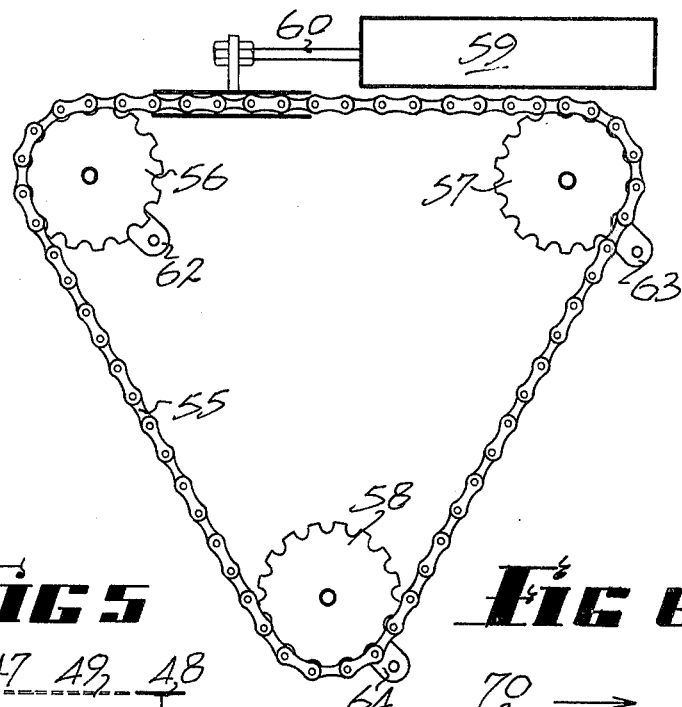
Figure 5:
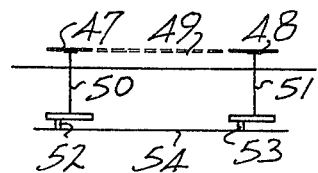
Figure 7:
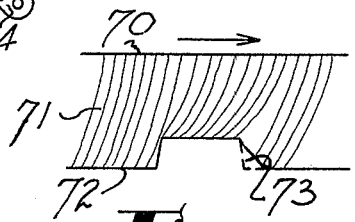

Referring now to the preferred embodiments these shall be described with the assistance of drawings in which:

FIG. 1 is a perspective view of a substantial portion of the apparatus as secured to the lid of a container this being according to a first preferred embodiment, FIG. 2 is a perspective view showing the apparatus together with the lid as secured over a container this also being according to the first preferred embodiment, FIG. 3 is a cross-sectional view of the apparatus as shown in FIG. 1 and part of that as shown in FIG. 2 again according to the first preferred embodiment, FIG. 4 is a schematic view showing as a plan some of the elemental mechanism of the first preferred embodiment, FIG. 5 is a schematic sketch of an arrangement according to a second embodiment, FIG. 6 is a plan view of an arrangement according to a third embodiment, FIG. 7 is a schematic illustration showing details of the way in which the bristles of a brush would be expected to flow over the raised portion of the polymerised portion of a photo polymer printing plate and FIG. 8 is a plan view again schematically showing another method according to a preferred fourth embodiment of how the apparatus could be arranged.

Figure 2:
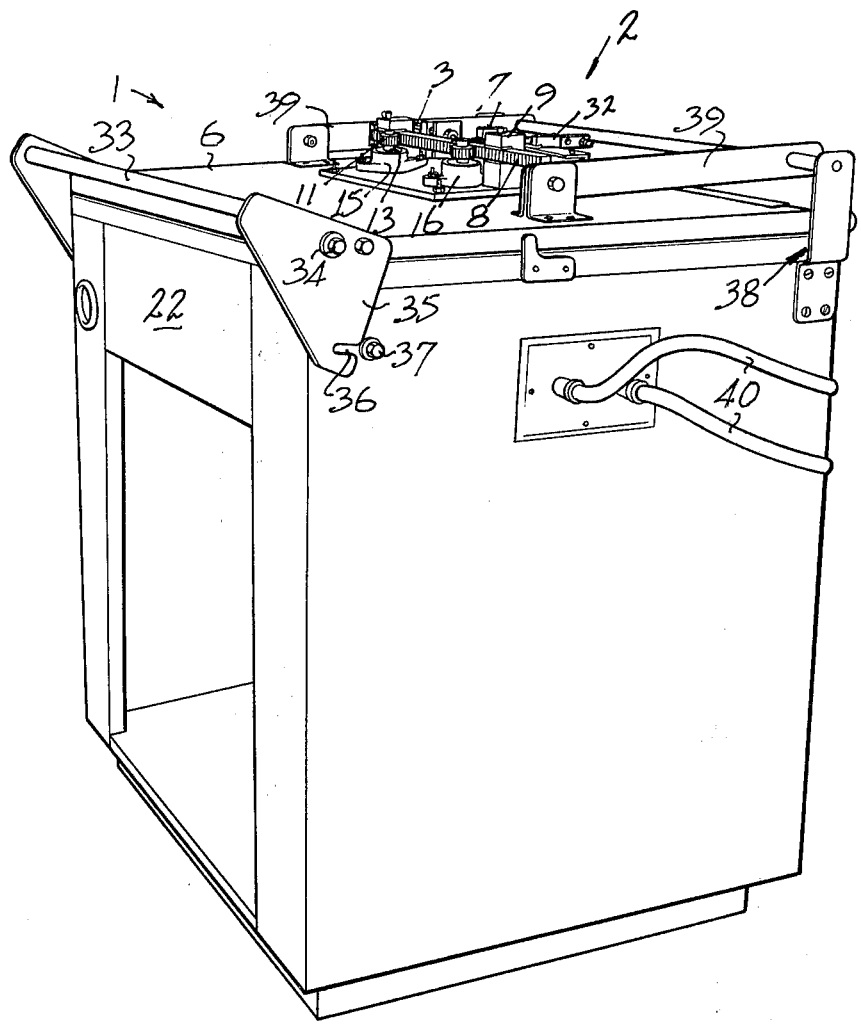

Referring now to the first embodiment as illustrated generally in FIGS. 1, 2 and 3, there is shown apparatus 1 for washing out of unpolymerised portion of a photo polymer printing plate such as that sold under the Trade Mark "NYLOPRINT".

The drive means 2 include a pneumatically operated ram 3 which includes a cylinder 4 and a piston with a piston rod 5.

The cylinder 4 is secured substantially rigidly to the lid 6.

The piston rod 5 is secured to bracket 7 which is in turn, secured to gear faced rack 8 which is held so as to be slidable only along a linear direction by linear bearings 9 and 10.

The rack 8 engages pinions 11 and 12 so as to rotate these pinions synchronously. The pinions in each case are secured through pivotally supported shafts 13 and 14 which are held in the pivotal connection by enclosed bearings 15 and 16 secured to the lid 6 so that the shafts 13 and 14 project through the lid 6 to terminate in cranks 17 and 18.

At the ends of cranks 17 and 18 there is secured a rotatable connection secured to photo polymer printing plate holding means 19. This is constituted by a plate which includes securing means 20 and clamping means (not shown) by which the photo polymer printing plate 21 can be held and supported beneath a level of solvent which shall be held within container 22.

Supported within the container 22 so as to be fully immersed in solvent that might be contained within the container are brushes 23, these in each case being independently supported by resilient spring means 24 which are tethered by tail-pieces 25.

In practice there are 6 such independent brush members 23 the illustration indicating 3 such brushes and there being 3 identical separately supported brushes behind these.

Support frame 26 is used with appropriate slots to hold the brush members 23 in position.

The brush members 23 in each case have upwardly projecting bristles 27.

With the printing plate holding means 19 supported in effect by only two cranks, it could be expected that some instability could arise and it is therefore a feature in this preferred embodiment that there be stabilising bearing pads 28 which are arranged simply to frictionally engage against the otherwise smooth back of the means 19 so as to act to hold this generally horizontal upon rotation reaction of the crank 17.

Referring now to the operation of the pneumatic ram 3, there is arranged so as to provide an oscillatory motion of the piston rod 5 and this is achieved by the bracket 7 contacting upon completion of its stroke in one direction or another the respective contactor 29 or 30. Each contactor operates an air pocket valve either 31 or 32 as the case might be which has the effects in each case of changing the position of a spool valve so that air will be changed in direction so that whereas it might in the first instance proceed in a direction causing the piston rod 5 to project more outwardly, upon operation of the air pocket valve 32 by contact of the contactor 30, this direction is changed and the piston rod 5 will then proceed in the reverse direction under the reversed action of the pneumatic air supply into the cylinder 4.

On completion of this action bracket 7 will contact contactor 29 which in turn will effect a changing pressure supply through air pocket valve 31 which changes the position of the spool valve which of course is not shown but this in turn changes the direction of the piston 5. The result of such control is to effect an oscillatory motion of the rack 8 which in turn synchronously varies the direction of rotation of the pinions 11 and 12 which in turn varies the rotational direction of the cranks 17 and 18.

The arrangement thus causes a relative motion to be effected between the "Nyloprint" 21 and the bristles of the brush members 23.

By supporting the holding member 19 in the manner described, this action will ensure that the member 19 remains in effect at its same orientation with respect to the sides of the container thus ensuring a container size that need be only slightly larger than a largest "Nyloprint" 21 size and, more importantly, the brushes in all cases will lay over in a consistently same direction upon one reversal and upon a changing of this direction, at least momentarily, the bristles will be directed against the new direction of motion and this will cause these to bite into and therefore excavate more aggressively into the sides of unpolymerised plastic material.

It is arranged in this preferred embodiment that rotation of the cranks 17 and 18 be of at least 360° which ensures bristles 27 moving with their reciprocating reversable parallel action will scrub the "Nyloprint" surface from all directions substantially uniformly.

In FIG. 2 in particular the container 22 is shown with the lid 6 in a closed position there being included 33 which is pivotally secured about an axial support member 34 so that bracket 35 can engage by means of slot 36 locking pin 37.

The lid is supported both by a rearwardmost pivot pin connection 38 and is controlled in its opening orientation by control bar 39. A hot water cooling conduit supply 40 is secured to the side of the container to provide heating of solvent within the container 22.

FIG. 4 illustrates the synchronous rotation of the two pinions the rack, in this case 41, driving through gear connection pinions 42 and 43 and these in turn driving for rotational motion the cranks 44 and 45. It will be seen that a third crank 46 can be used to support the underneath plate and this can be held so as to be idling, so long as two of the cranks are synchronously driven this will determine the relative motion of the holding means with respect to the brush means.

This is perhaps more clearly shown in FIG. 5 which again is illustrative and shows the synchronous driving of pinions 47 and 48 by some common connection which need not be specified 49 and there being drive shafts 50 and 51 driving cranks 52 and 53 so as to determine the relative motion of the holding means 54.

Whereas the third crank as in FIG. 4 can be left free, it is of course possible to couple this fourth synchronous operation and this can be achieved by using a chain 55 which engages in each case the sprockets 56, 57 and 58 and of course the reciprocal drive of the chain 55 can be by way of hydraulically or pneumatically driven ram 59 which through mechanisms not shown drives with an oscillatory motion piston rod 60 which is coupled through clamp means 61 to the chain 55.

In each case then, the cranks 62, 63 and 64 would be coupled to the photo polymer printing plate holding means and the motion would be determined by such drive.

Figure 8:
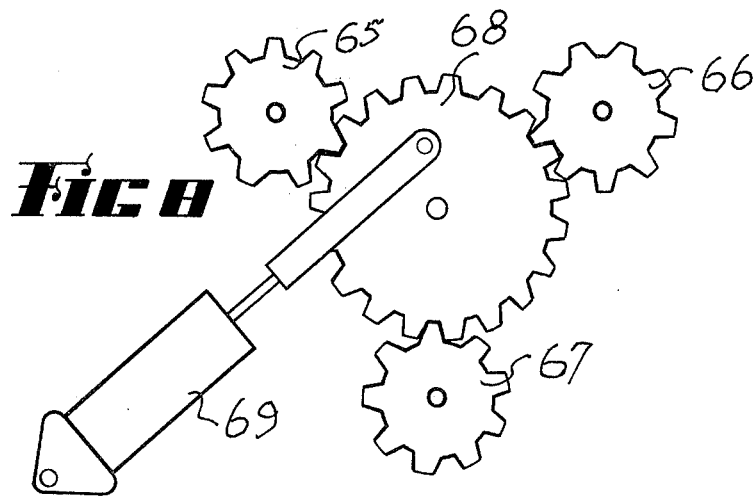

Another method of synchronously driving three cranks is shown in FIG. 8 in which gears 65, 66 and 67 are driven by common gear wheel 68 through connection of ram 69.

In FIG. 7 this shows somewhat schematically and indeed for the sake of simplicity in what is in effect as compared with the description in the first embodiment upside down, a brush 70 with bristles 71 and the exposed face of a "Nyloprint" printing plate 72. It will be seen that the direction of the bristles as would of course be expected, lie so that these are trailing the forward direction of the brush member but if the direction is reversed at any time, the bristles will then bite into the raised edge 73 of the polymerised portion of the plate 72.

Because the sides of the polymerised portion of the plate are inclined although dependent upon the angle of light falling through a negative on to the photo polymer material at a fairly acute angle, nonetheless it is necessary to have a very clean print that the "bite" of the bristles be substantial to ensure adequate cleaning on what might be termed the shoulders of the raised portions of the "Nyloprint".

Throughout this specification reference has been made to brush means and to bristles but it is to be clear that this term is used mainly for convenience but it is not to exclude materials that might normally be of softer character than brush as such for instance materials generally known within the arts as "plush" and the term "brush means" is throughout the specification considered to include this material and the term "bristles" is to include projections issuing from "plush".

It will now be seen that a very economical machine can be made which will have negligible danger of providing sparking which can cause explosions of the vaporous fumes from the selected solvent.

The provision of an air supply as might be necessary is usually very common or can be achieved with minimal cost and the drive means are all standard parts which can be mass produced and in fact purchased almost on the basis of "off the shelf" prices.

Moreover the arrangement can result in a very economic apparatus and one that is reliable both because the units in each case are well known and well tried but also because all of the apparatus is readily visible and being of simple mechanical character can be readily fixed by most people even vaguely familiar with mechanical devices.

Care has been taken throughout the specification not to distinguish between the direction of the bristles, that is, these should either depend downwardly or should project upwardly except in the description of the preferred embodiment in that the position can be a matter of choice as can be the driving of one or other of the relatively moving members within the solvent.

The apparatus as shown can be covered with a clear protective shield and the exhaust air from the pneumatic rams can be directed into this area so as to keep this at a positive pressure and to ensure even more positively that there is a minimal build up of vaporous fumes within the thus enclosed area.

I claim:

1. An apparatus for the washing out of an unpolymerised portion of a photo polymer printing plate, the apparatus being of a type including a container for holding of selective washing out solvent, photo polymer printing plate holding means to hold the printing plate with at least the exposed face of the printing plate within solvent contained within the container, brush means within the container with bristles positioned to engage against the exposed face of any photo polymer printing plate held by the photo polymer printing plate holding means, and drive means to effect relative movement between the photo polymer printing plate holding means and the brush means whereby to effect a scrubbing action against the exposed face of any photo polymer printing plate held by the photo polymer printing plate holding means, the invention being characterized in that the drive means include a fluid operated motor means, by which the relative movement between the photo polymer printing plate holding means and the brush means is able to be effected, and mechanically operable change over means arranged to periodically stop the said relative movement proceeding in one direction of a predetermined path and cause this to recommence in a contra direction, and this arranged so as to cause the bristles of the brush means to at least move momentarily against their formerly laid over direction.

2. An apparatus as in claim 1 further characterized in that the drive means include a rotatable crank, the crank portion of which is secured to the photo polymer printing plate holding means.

3. Apparatus as in claim 1 further characterized in that the drive means include at least two cranks, spaced apart and pivotally supported with respect to common support means, the pivot axes being in each case parallel one with respect to the other and the crank in each case being secured to the photo polymer printing plate holding means.

4. Apparatus as in claim 3 further characterized in that the said two cranks being each pivotally supported with respect to a common support means, are coupled to the drive means by a common drive coupling whereby each crank is drivable synchronously one with respect to the other.

5. Apparatus according to claim 3 further characterized in that the container includes a container portion to hold solvent, and a lid portion, the drive means being supported by the lid portion, the cranks in each case being pivotally secured with respect to the lid with a crank portion being positioned below the lid.

6. Apparatus as in claim 1 in which the motor means is constituted by a pneumatic ram including a piston within a cylinder.

7. Apparatus according to claim 6 further characterized in that the motor means is adapted to be connected to a supply of high air pressure and such supply of air pressure includes means to change the supply so as to change the direction of motion of the piston with respect to the cylinder.

8. Apparatus according to claim 6 further characterized in that the means to effect a change of supply include a valve arranged to be operated upon by a selected extension or retraction of the piston with respect to the cylinder.

9. Apparatus according to claim 6 further characterized in that the piston is secured to a rack which engages pinions, one secured to each of the two cranks.

10. Apparatus according to claim 1 in which the drive means includes a chain synchronously coupling drive sprockets wherein to drive through crank connections a photo polymer printing plate holding means.

11. Apparatus for washing out of an unpolymerised portion of a photo polymer printing plate, the apparatus being of a type including a container for holding washing out solvent, photo polymer printing plate holding means to hold the photo polymer printing plate with at least the exposed face of the photo polymer printing plate within solvents within the container, brush means within the container with bristles in a position to engage against the exposed face of any photo polymer printing plate held by the photo polymer printing plate holding means, and drive means to effect relative movement between the photo polymer printing plate holding means and the brush means whereby to effect a scrubbing action against the exposed face of any photo polymer printing plate held by the photo polymer printing plate holding means, the invention being characterized in that the drive means is constituted by including a pneumatic ram including a double acting piston held within a cylinder, contactors operable by the position of the piston with respect to the cylinder arranged so as to change the supply of air at pressure whereby to reverse the direction of motion of the piston with respect to the cylinder and effect a repeating alternating movement, a rack secured to the piston, pinions, rotatably held and engaging the rack so as to be synchronously driven by the rack, each pinion being secured to a crank member, each crank member being secured so as to be parallel, one with respect to the other, there being two such crank members and being held so that the crank portion of the crank member is positioned below the lid, and photo polymer plate holding means secured jointly by each of the ends of the crank member, and brush means constituted by a plurality of separately mounted and independently movable brush members each resiliently supported and positioned so that the bristles of the brush members are projecting upwardly and arranged to engage any photo polymer printing plate secured to the underneath side of the photo polymer printing plate holding means and the arrangement being so arranged that upon each reversal of movement of the photo polymer printing plate holding means with respect to the brush means, the bristles of the brushes will at least momentarily bite into any photo polymer printing plate secured to the holding means.

12. Apparatus according to claim 11 in which the photo polymer printing plate holding means are secured by three crank support members.

* * * * *